United States Patent [19]

Yoshida et al.

[11] Patent Number: 5,551,014

[45] Date of Patent: Aug. 27, 1996

[54] METHOD AND APPARATUS FOR DESIGNING INTEGRATED CIRCUITS ACCORDING TO MASTER SLICE APPROACH

[75] Inventors: Kazuhiro Yoshida; Noriaki Sato, both of Kasugai, Japan

[73] Assignees: Fujitsu Ltd., Kanagawa; Fujitsu VLSI Ltd., Aichi, both of Japan

[21] Appl. No.: 396,789

[22] Filed: Mar. 1, 1995

[30] Foreign Application Priority Data

Mar. 14, 1994 [JP] Japan .................. 6-042838

[51] Int. Cl.⁶ .................. G06F 15/00; G06F 13/00
[52] U.S. Cl. .................. 395/500; 364/488; 364/489; 364/490; 364/491; 364/578
[58] Field of Search .................. 364/488, 489, 364/490, 491, 578, 512; 395/500, 140–156, 183.02, 183.08, 183.22, 115, 163; 371/22.1, 22.3; 326/47–49, 401, 86, 41–45, 440; 257/203, 207, 211; 365/63, 51, 189.06, 230.06

[56] References Cited

U.S. PATENT DOCUMENTS

| | | | |
|---|---|---|---|
| 4,789,944 | 12/1988 | Wada et al. | 364/488 |
| 4,922,432 | 5/1990 | Kobayashi et al. | 364/490 |
| 5,038,294 | 8/1991 | Arakawa et al. | 364/490 |
| 5,050,091 | 9/1991 | Rubin | 364/490 |
| 5,051,938 | 9/1991 | Hyduke | 395/500 |
| 5,084,824 | 1/1992 | Lam et al. | 364/490 |
| 5,220,512 | 6/1993 | Watkins | 364/489 |
| 5,325,309 | 6/1994 | Halaviati et al. | 364/578 |
| 5,384,710 | 1/1995 | Lam et al. | 364/489 |
| 5,414,639 | 5/1995 | Sugimoto et al. | 364/489 |
| 5,423,023 | 6/1995 | Batch et al. | 395/500 |

*Primary Examiner*—Kevin J. Teska
*Assistant Examiner*—Jacques H. Louis-Jacques
*Attorney, Agent, or Firm*—Staas & Halsey

[57] ABSTRACT

A CAD system designs mask patterns for use in a master slice integrated circuit processing. The system includes an input device such as a mouse interface, and a display unit for symbolically displaying circuit elements and cells. A first data base stores a net list of circuit design information. A second data base stores data relating to the structure of a master slice bulk and various types of elemental cells formed in the master slice. A processing unit of the CAD system causes the display unit to display both a circuit design scheme and the master slice bulk on a screen of the display unit. The processing unit produces data about the initial positions of a pair of contact hole patterns by which a resistor is defined in a resistive cell region of the master slice, and automatically shifts the contact hole patterns from the initial positions to another position, in order to avoid interference between a wiring pattern on the master slice bulk and the contact hole patterns.

10 Claims, 8 Drawing Sheets

METHOD AND APPARATUS FOR DESIGNING INTEGRATED CIRCUITS ACCORDING TO MASTER SLICE APPROACH

BACKGROUND OF THE INVENTION

1. Field of the Invention

The present invention relates generally to a method and apparatus for designing a large scale integrated circuit (LSI) for analog circuits. In particular, the present invention relates to a design technique which positions contact holes formed in an insulating layer on a master slice, prior to the connection of resistive cell regions in the master slice.

2. Description of the Related Art

Semiconductor integrated circuits designed and manufactured using the so-called master slice technique have circuit elements laid out on integrated circuit wafers in a way that optimizes the wiring or interconnection of the various circuit elements. The wiring done among circuit elements organized in this fashion is generally known as "personalization" or "customization".

A master slice is generally a silicon wafer containing 30 or more groups of components interconnected to form desired circuits. The components or elements of a master slice for an analog circuit may include, for example, bipolar transistor elements, capacitor elements, and resistive cell regions, formed in or on a semiconductor substrate. During personalization, an insulating layer is formed on the surface of the master slice. Thereafter, in order to use a part of a resistive cell region as a resistive element having a desired resistance, two contact holes are formed in the insulating layer over the resistive cell region. Contacts serving as interlayer wirings in the two holes connect the resistive cell region to wirings formed on the insulating layer. Formation of two contacts cause a part of the resistive cell region to be defined as a resistive element, with the resistance being determined by the spacing between the two contacts. Thus, during personalization of a master slice, various resistive elements can be defined by accurate positioning of the contact holes in the insulating layer.

Design techniques today used to develop digital gate arrays according to the Master Slice technique often incorporate a symbolic layout environment. Such an environment shortens the development period for digital LSI circuit design. A similar layout environment would also shorten the development period for designing analog LSI circuits.

In circuit layout design according to Master Slice Approach, a designer operates a pattern editor with reference to a desired circuit plan drawn on paper. In general, a pattern editor is built into a computer aided design (CAD) system having a display and an input device, e.g. a mouse interface. A bulk model of a master slice is displayed on the display screen, and represents parameters of the master slice such as bulk resistance, bulk noise, bulk modules as well as the transistance and capacitance of various regions formed in or on the semiconductor substrate.

The circuit layout designer specifies one element on the bulk model by operating the mouse or other input device. This effectively positions the element on the master slice. The designer then operates the input device to draw horizontal wiring patterns connecting the variously displayed elements. The wiring procedure is accomplished using contact patterns as vertical wirings to connect the horizontal wirings and terminals of the individual elements.

For example, as shown in FIG. 1A, a pair of contact hole patterns 91 and 92, spaced apart from each other by a distance L3, can be drawn above a resistive cell region 90 in a bulk model. Consequently, a part of the resistive cell region 90 can be used as a resistive element having a resistance determined by the distance L3. The designer is free to decide where the two contact hole patterns can be properly disposed within the resistive cell region 90. To do this, the designer must compute the length L3 by a manual operation or using a computer, based on the specified resistance values and parameters of the resistive cell region 90 (i.e. sheet resistance and the width of the cell region), shown in the circuit diagram. In other words, the designer must determine the contact hole spacing L3 in advance of his using the pattern editor.

During the wiring setting process, after the two contact hole patterns 91 and 92 have been positioned somewhere above the resistive cell region 90 as in FIG. 1A, it may turn out that a wiring 93, isolated from the first pattern 91, should preferably be placed where the first pattern 91 has been set. In this case, the first pattern 91 must be repositioned (or relocated) somewhere above the resistive cell region 90 in order to prevent it from overlapping the wiring pattern 93.

However, as long as the conventional pattern editor is used, the designer must operate the mouse or other input device such that the second pattern 92 is disposed at a position apart from the first pattern 91 by the spacing L3. This occurs after the reposition of the first pattern 91. Such a relocation operation is time consuming and troublesome for the designer. Furthermore, when a pattern has to be repositioned, the LSI design must once again undergo logical simulation to determine whether or not the mask patterns of the master slice conform to the circuit design. This is necessary to avoid circuit layout mistakes.

One method of defining a desired resistive element is to dispose a resistive element specifying pattern, integrated with two contact hole patterns, over the resistive cell region 90.

One disadvantage of this method, however, is that in order to adjust the relationship between the positions of two contact hole patterns and the position of a wiring pattern crossing the resistive element specifying pattern, the pattern library of the CAD system must store a plurality of resistive element specifying patterns having the same contact hole spacing, for example, a first resistive element specifying pattern such as that shown in FIG. 1B, in which two hole patterns 94 and 95 spaced apart from each other by a distance L3 are disposed in an approximately center of the resistive cell region 90, and a second resistive element specifying pattern such as that shown in FIG. 1C, in which two hole patterns 96 and 97 spaced apart from each other by a distance L3 are disposed closer to the right-hand end of the resistive cell region 90. A considerably large number of resistive element specifying patterns are required to account for instances of contact hole spacing representative of a single resistive value. Since many kinds of resistive elements and values are used in a single circuit design, the pattern library must store an enormously large number of resistive element specifying patterns. Consequently, the resistive element defining method requires a pattern library with a large storage capacity and a great deal of time and labor for preparing an enormously large number of patterns.

SUMMARY OF THE INVENTION

Accordingly, it is a primary objective of the present invention to provide a circuit designing apparatus which allows efficient and reliable designing of semiconductor integrated circuits in accordance with Master Slice Approach.

It is further objective of the present invention to provide a circuit designing system capable of computing the length of a resistive element and repositioning a contact hole pattern by using information about resistive elements formed in a master slice, e.g. net list information, element cell information and pattern information, which are collectively managed by the system.

To achieve the foregoing and other objects and in accordance with the purpose of the present invention, an improved circuit designing apparatus is provided, for designing a pattern of a mask used in a master slice exposure process.

The apparatus according to the present invention comprises an input device, a display device, a first and second data bases, a data storage file and a processing unit, which are coupled together. The input device is for inputting commands given by an operator respecting the choice of circuit element. The display device symbolically displays circuit elements and cells, and accommodates a first and a second window of data displayed on the display device. The first data base stores a net list descriptive of a circuit design including a resistive element having a predetermined resistance. The second data base stores data relating to a bulk structure of a master slice and to a plurality of types of circuit cells, including at least one resistive cell, formed in the master slice.

The processing unit:

processes the net list to cause the display device to display a circuit design scheme in the first window and to display a master slice bulk model in the second window, designates circuit cells used in the circuit design in response to operator input, by referring to the net list and to master slice circuit cell data, in order to prepare circuit cell data descriptive of the designated circuit cells, computes a length of a resistive element to be formed in the resistive cell, which is one of the designated circuit cells, based on the circuit cell data and on the resistance value of the resistive element, prepares initial position data of a first contact hole for the designated resistive cell, based on the circuit cell data, prepares initial position data of a second contact hole paired with the first contact hole, based on the computed length and on the initial position of the first contact hole, the distance between the first and second contact holes corresponding to the computed length, and stores data concerning the circuit cells, the computed length and the positions of the first and second contact holes into the data storage file, whereby a third data base is created in the data storage file.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings, in which:

DETAILED DESCRIPTION OF THE PREFERRED EMBODIMENTS

Figure 1A:
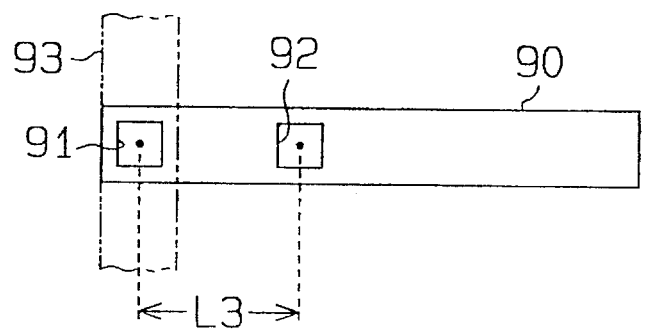
FIGS. 1A, 1B and 1C each illustrate contact hole patterns disposed on a semiconductor substrate according to a conventional design method.
Figure 1B:
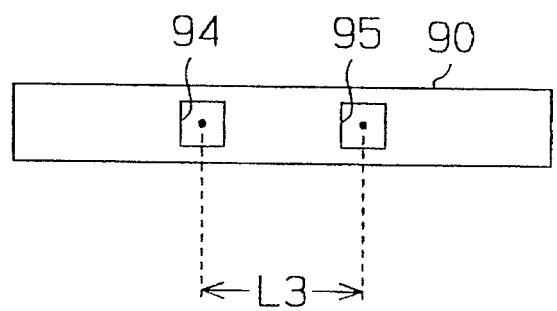
Figure 1C:
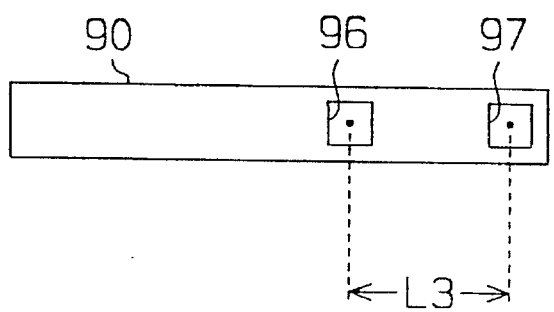
Figure 2:
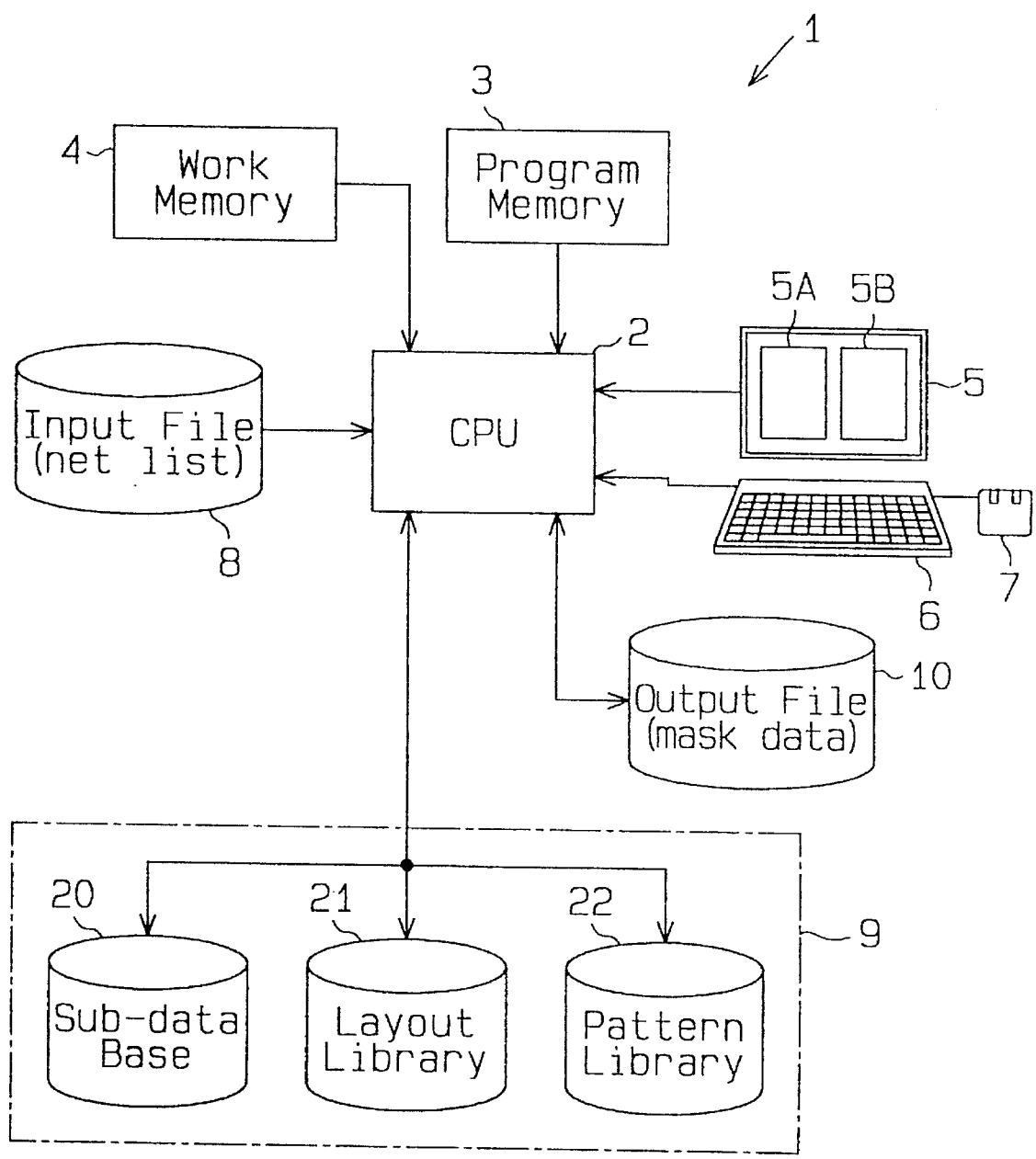
FIG. 2 is a block diagram showing various elements in the circuit design system according to one embodiment of the present invention.

An embodiment of the present invention will be described below with reference to FIGS. 2 to 13. FIG. 2 shows a data preparation system 1 for preparing mask data. The mask data is used for the production of masks used in an exposure process for forming a master slice type LSI.

Figure 5:
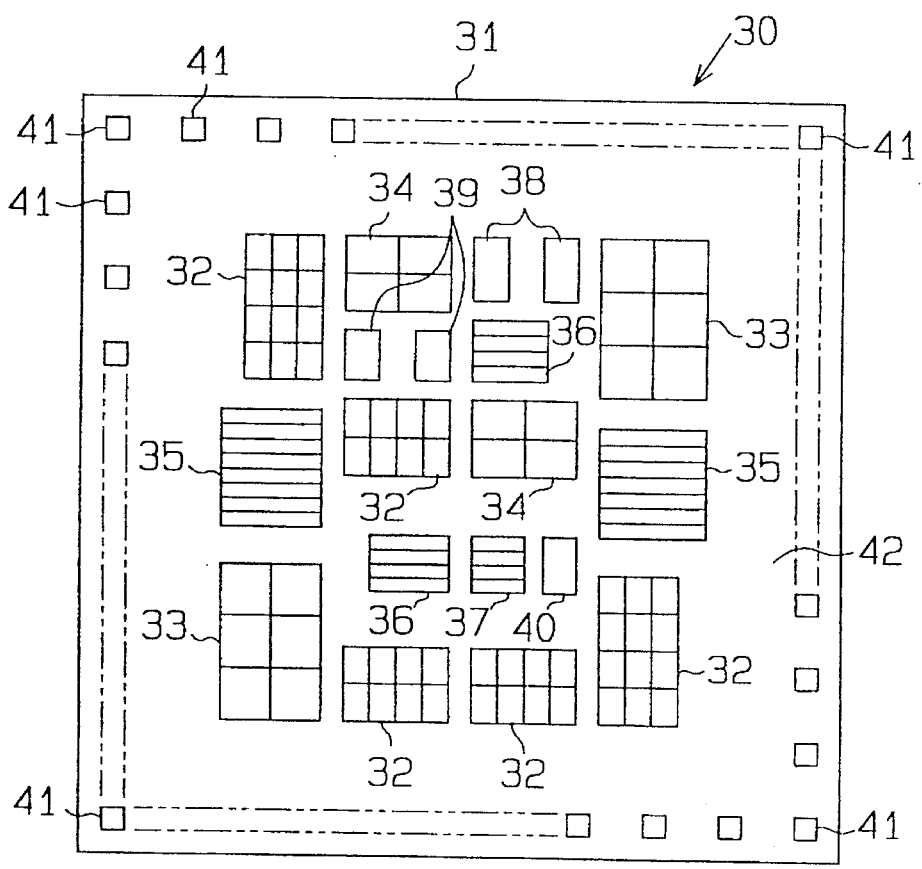
FIG. 5 shows a bulk arrangement of a master slice for an analog circuit.

FIG. 5 shows one example of a master slice 30 which is a chip used to produce an analog circuit. The master slice 30 includes a plurality of bipolar type transistor cell groups 32, 33 and 34, a plurality of resistive cell groups 35, 36 and 37, and capacitor element cells 38, 39 and 40, which are provided on or in a semiconductor substrate 31.

Each of the transistor cell groups 32, 33 and 34 includes a plurality of transistor cells having the same configuration and the same size. However, the transistors in the cell group 32, those in the cell group 33, and those in the cell group 34 are different from each other in configuration and size.

Each of the resistive cell groups 35, 36 and 37 includes a plurality of resistive cells having the same configuration and the same size. However, the resistive cells in the respective resistive cell groups 35, 36 and 37 are different from each other in length and width. A resistor that exhibits a predetermined resistance is defined in a resistive cell by positioning two contact holes over the resistive cell.

Various circuits can be formed by combining together transistors in the transistor cell groups 32 to 34, resistors defined in the resistive cells of the resistive cell groups 35 to 37, and the capacitor cells 38 to 40. A region lying between the transistor cell groups, the resistive cell groups and the capacitor cells is used as a wiring region 42 where wiring connections between the cells are laid. An LSI having a desired function is produced by forming the necessary wiring and hole contacts as vertical wiring to connect the wiring and the cells on the master slice 30. The outer peripheral region of the substrate 31 is provided with a multiplicity of pads 41 that serve as external input/output terminals including bumps.

Layout design for an LSI utilizing the master slice 30 is carried out using the data preparation system 1. Mask data relating to the design of a mask, used in an exposure process for the master slice 30, is prepared on the basis of layout data prepared by the layout design.

FIG. 2 illustrates the organization of a computer aided design (CAD) system forming the data preparation system 1. The data preparation system 1 has a central processing unit (CPU) 2, a program memory 3 for storing a control program for the CPU 2, a work memory 4 for temporarily storing data, a CRT 5 as a display unit, a combination of a keyboard 6 and a mouse interface 7 as input devices, an input file 8, and an output file 10 for storing mask data. The data preparation system 1 further comprises a disk system 9 comprising a sub-data base file 20, a layout library file 21, and a pattern library file 2. The CRT 5 can display two windows 5A and 5B on its screen under the screen control of the CPU 2.

The input file 8 stores a net list as information descriptive of the specifications of a circuit to be produced by using the master slice 30. The net list may include, for example, an emitter coupled logic (ECL) circuit 23 as shown in FIG. 4.

Figure 4:
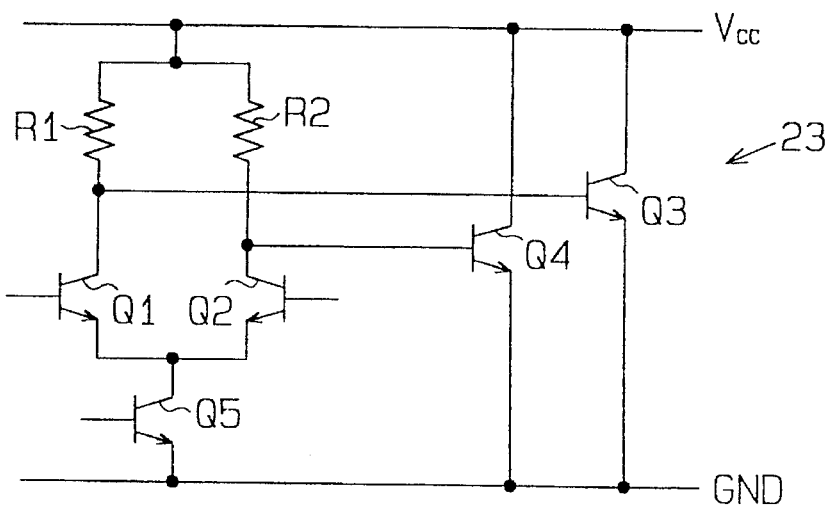
FIG. 4 shows one example of a circuit designed by using a master slice.

As illustrated in FIG. 4, the ECL circuit 23 has NPN transistors Q1 and Q2, an NPN transistor Q5 as a constant-current source, resistors R1 and R2, and NPN transistors Q3 and Q4 as output transistors. The emitters of the transistors Q1 and Q2 are coupled together and connected to a ground GND through the transistor Q5. The collectors of the transistors Q1 and Q2 are connected to a power source $V_{cc}$ through the respective resistors R1 and R2 and to the respective bases of the transistors Q3 and Q4. Each of the transistors Q3 and Q4 has a collector connected to the power source $V_{cc}$ and a grounded emitter.

The net list for the ECL circuit 23 includes data about the types of elements used in the circuit 23, the wiring network connecting the terminals of the elements, the resistance values of the resistors R1 and R2, and the types of resistive cells used as the resistors R1 and R2.

Figure 6:
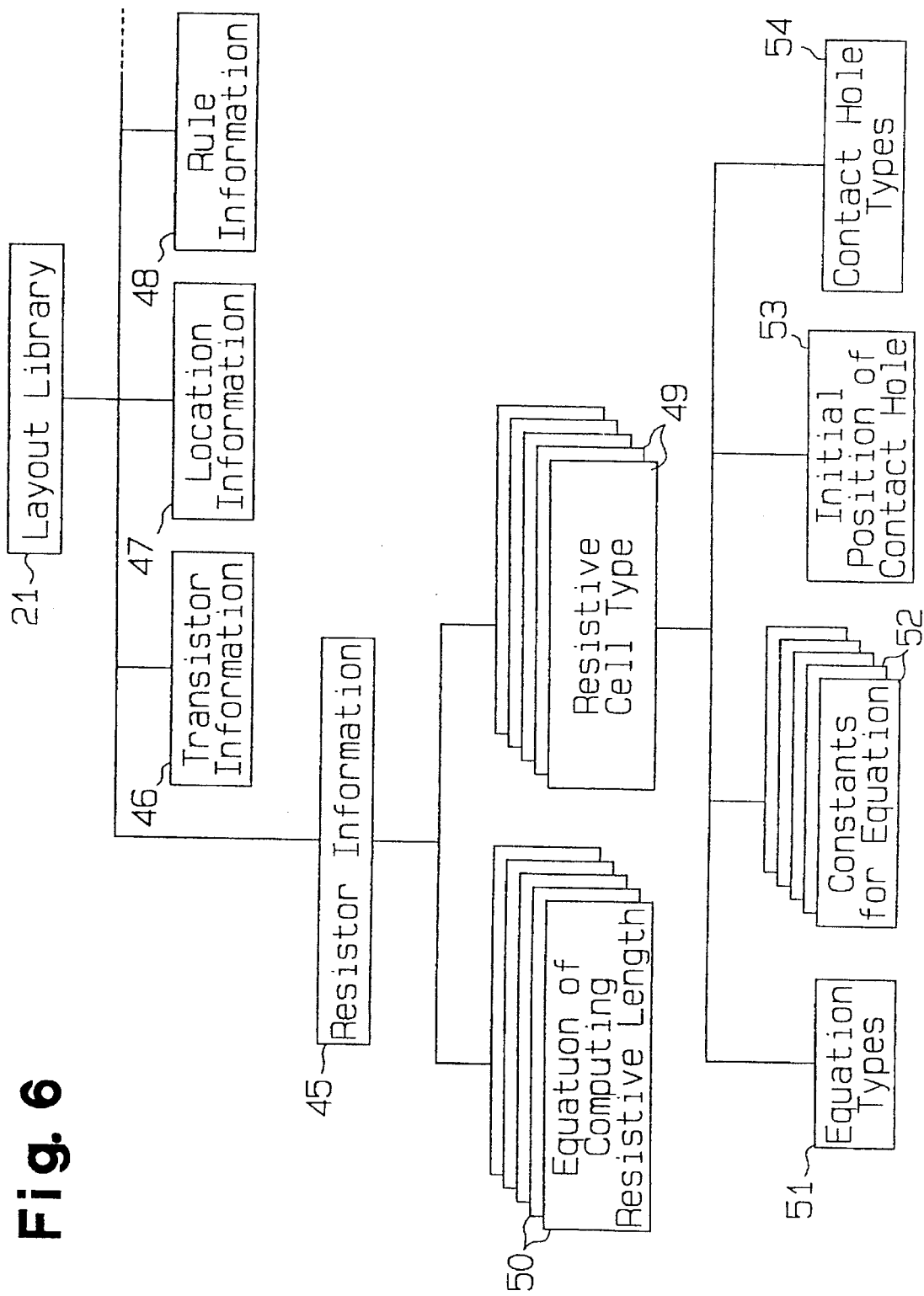
FIG. 6 shows a hierarchical structure of a layout library file.
Figure 7:
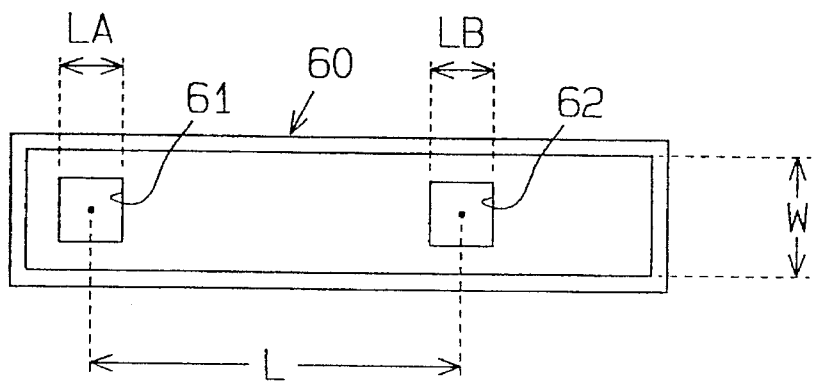
FIG. 7 is a plan view showing a resistive element using a part of a resistive cell region.

The layout library file 21 shown in FIG. 2 stores information about all circuit elements formed in or on the substrate or bulk of the master slice 30. As shown in FIG. 6, the circuit element information includes resistor information 45, transistor information 46, location information 47, and rule information 48, described below in detail.

The location information 47 consists essentially of data indicating where each resistive cell region and each transistor cell region are located on the bulk.

The rule information 48 is data descriptive of various rules used when a desired circuit is designed; for example, rules for determining the positions of hole contacts, positioning rules governing the method of positioning elements on or in the substrate, and design rules to verify whether or not wirings can be laid at positions specified by the designer. The position rules are used to verify whether or not circuit elements can be located at specified positions.

The rules for determining hole contact positions are used to position a pair of contact hole patterns. The contact hole pattern is required to define a resistive element in a resistive cell region. The position of each contact hole pattern is expressed by the coordinates (x, y). These coordinates represent the center of the pattern with respect to the origin of a two-dimensional coordinate system set on the resistive cell region. One of the two contact hole patterns is regarded as a primary contact hole pattern, and the other as a secondary contact hole pattern. The initial position of the primary contact hole pattern is specified as initial coordinates with respect to the origin of the coordinate system, e.g. (x1, y1). The initial position of the secondary contact hole pattern is specified as coordinates obtained by adding a desired resistance length Lx to the initial coordinates of the primary contact hole pattern, e.g., (x1+Lx, y1).

The resistor information 45 includes information 49 descriptive of types of resistive cells, and data 50 descriptive of equations used to compute the length for each type of resistive cell. Each of these equations incorporate resistance values and resistive cell characteristic constants (e.g., sheet resistance, cell width, and contact hole pattern size), described in a net list, as computation parameters. For example, the resistance length L may be expressed by the following equation (1).

$$L=(xW)/V+(LA/2+LB/2) \tag{1}$$

where

L: resistance length (μm)

R: resistance value (Ω)

W: resistive cell width (μm)

V: sheet resistance (Ω per square of unit lengths)

LA: width of first hole pattern (μm)

LB: width of second hole pattern (μm)

The resistive cell type information 49 consists essentially of equation type information 51, equation constant information 52, initial contact hole pattern position information 53, and contact hole information 54, described below.

Equation type information 51 includes a data list indicative of the correspondence between resistive cell types and length computation equations associated with the resistive cell types. With reference to the data list, one of the length computation equations can be selected in accordance with a particular resistive cell type.

The equation constant information 52 is data about parameter constants used in each equation corresponding to each type of resistive cell. The parameter constant data includes, for example, the width W of a resistive cell in a resistive cell region 60 shown in FIG. 7, the respective widths LA and LB of a pair of first and second contact hole patterns 61 and 62 disposed over the cell region 60, and the sheet resistance V of the cell region 60. The parameter constant data further includes data about the length which each of a pair of contact hole patterns can be shifted without extending beyond a resistive cell.

Figure 8:
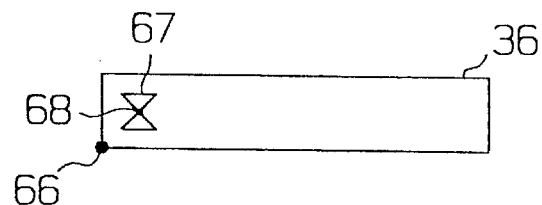
FIG. 8 shows one example of the layout of a contact hole pattern on a resistive cell region.

The initial contact hole pattern position information 53 is data indicating an initial position on a resistive cell region where a contact hole pattern is initially positioned. The initial position data includes, for example, the coordinates of a center 68 of a primary contact pattern 67 with respect to the origin 66 of a two-dimensional coordinate system set on a resistive cell 36, as shown in FIG. 8.

The contact hole type information 54 is formed by a data list and is used to manage the type of contact hole pattern formed in an insulating layer on a resistive cell and within a master slice. The contact hole data list contains the record of code names of all contact hole pattern types, for example, the code names of the first and second contact hole patterns 61 and 62 shown in FIG. 7.

The pattern library 22 in the disk system 9 stores information about various wiring patterns and contact hole patterns required to prepare a mask used in an exposure process for the master slice 30. This information includes, for example, the code names for the individual wiring and contact hole patterns.

The program memory 3 stores a control program executed by the CPU 2. The control program is composed of various programs, i.e., a program for preparing a data base in the sub-data base file 20 referring to a net list, a positioning program for laying out circuit elements on the bulk model of the master slice 30, a wiring program for patterning wirings on the bulk model of the master slice 30, and a hole contact shift program for positioning each hole contact at an appropriate position in a resistive cell region.

Figure 3:
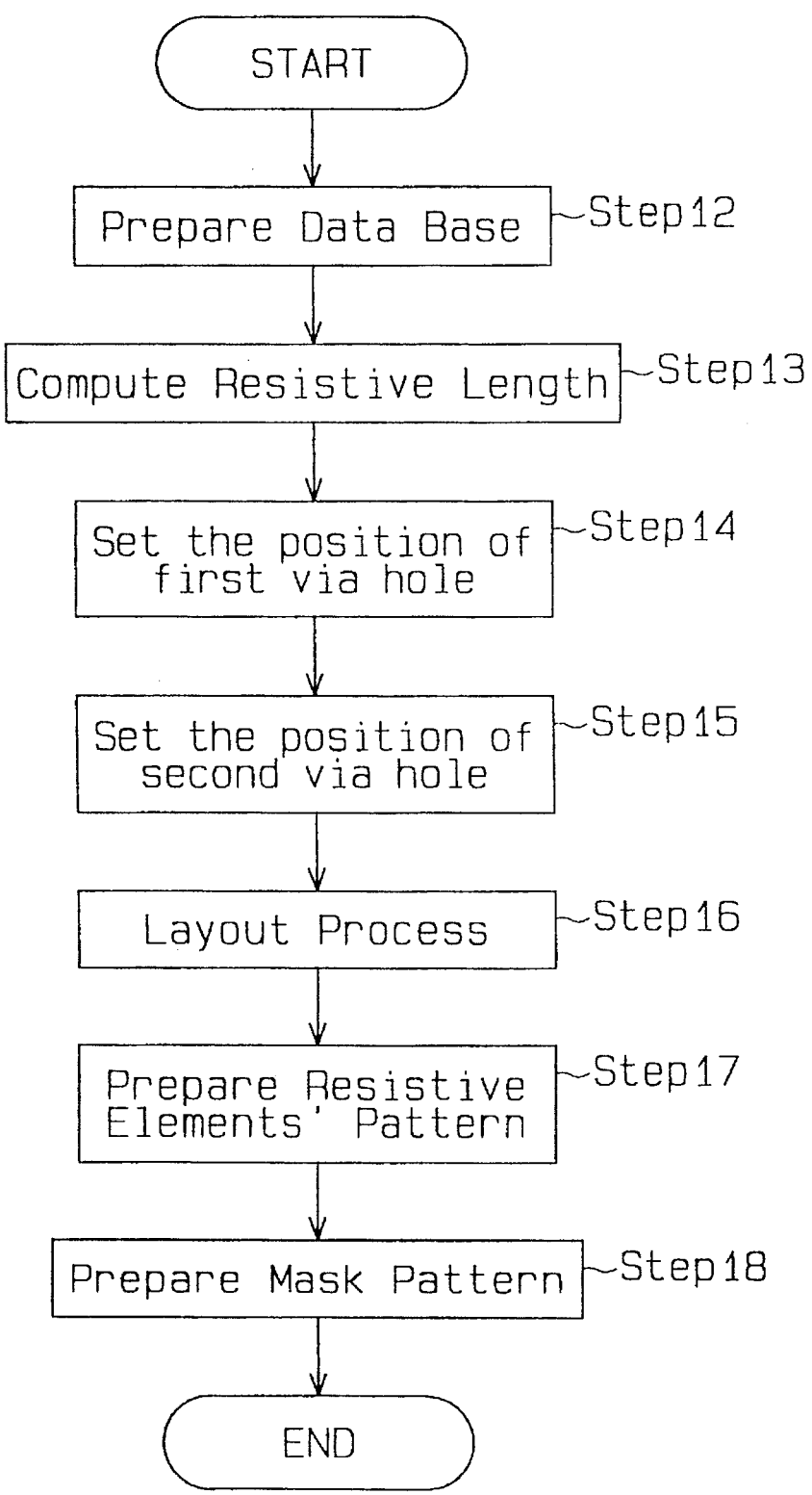
FIG. 3 is a flowchart illustrating processes executed by the designing system shown in FIG. 2.

Next, processing executed by the CPU 2 according to the control program will be explained with reference to the flowchart of FIG. 3.

At Step 12, a data base preparation process is executed. The CPU 2 loads a net list relating to a specific semiconductor chip from the input file 8 and stores it in the work memory 4. In general, a semiconductor circuit design utilizes a hierarchical structure with graded ranks according to the scales of internal circuits or cells. Consequently, each net list is also hierarchically arranged. The CPU 2 stores element data regarding all circuits ranging from the highest rank circuit to the lowest rank circuit in the work memory 4. Then, the CPU 2 transfers all information stored in the work memory 4 to the sub-data base file 20. Resistance value data and resistive element type data are also stored in the sub-data base film 20 as a part of the element data.

At step 13, the CPU 2 reads out necessary data regarding a resistance value and a type of resistor from the sub-data base file 20 in order to compute the length of a resistive element to be defined on the master slice. The CPU 2 then specifies a length computation equation corresponding to the specified type of resistor type. Specifically, the CPU 2 refers to the equation type information 51 in the layout library 21, and selects a specified length computation equation, e.g. the above equation (1), from the group of computation equations 50. The selected equation is loaded into the CPU 2 in text style or text format. The CPU 2 analyzes the equation (1) while discriminating operation symbols (i.e., x, /, and +) and variable symbols (i.e., R, V, W, LA, and LB), and computes the length L, substituting the constant values of V, W, LA and LB and the resistance value of R into the equation (1). The resultant length L is stored into the sub-data base file 20 as a part of data about the specified resistive element.

At Step 14, the CPU 2 sets the position of a primary or fundamental contact hole in a specific resistive cell region. In particular, the CPU 2 reads resistor type specifying data from the sub-data base file 20. With this data, the CPU 2 reads out the coordinates of the initial position of a primary contact hole pattern, for example, the primary contact hole pattern 67 shown in FIG. 8, from the initial contact pattern position information 53 in the layout library file 21. The CPU 2 regards these coordinates as the position of a first hole contact, and registers its coordinates as the coordinates of the fundamental hole contact for the resistive element in the sub-data base file 20. It should be noted that the fundamental hole pattern 67 in FIG. 8 is expressed symbolically.

At Step 15, the CPU 2 sets the position of a secondary contact hole. The CPU 2 reads out data about the length and the coordinates of the primary contact hole from the sub-data base file 20. On the basis of the primary contact hole coordinates and the length of the resistive element, the CPU 2 computes the coordinates of the initial position of a secondary contact hole pattern according to the rules described as the rule information 48. The computed coordinates are registered as the coordinates of the secondary hole contact in the sub-data base file 20. As a result, the sub-data base file 20 stores a pair of items of data about the respective coordinates of the primary and secondary contact hole patterns. The contact hole pattern data also involves contact hole data selected from the contact hole type information 54 in the layout library file 21 in accordance with the specified resistor type. The contact hole pattern data is also used for a wiring rule check during layout process, described later.

Figure 9A:
FIG. 9A shows one example of a resistor described in a circuit diagram.
Figure 9B:
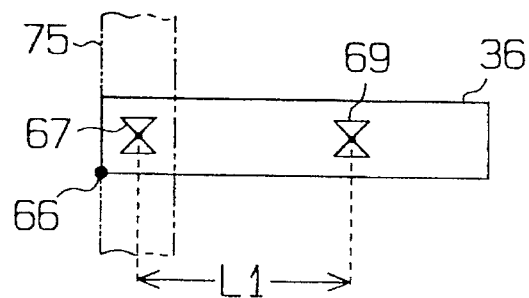
FIG. 9B shows the layout of contact hole patterns defining the resistor shown in FIG. 9A.

When a resistor R10 as shown in FIG. 9A is to be defined in a resistive cell 36 as shown in FIG. 9B, the initial position of a second contact hole pattern 69 is set at a position spaced apart from the initial position of a first contact hole pattern 67 by interval L1. Thus, the coordinates of the second contact hole pattern 69 are determined so that the length of a resistor defined in the resistive cell 36 is equal to the interval L1. The coordinates are then registered in the sub-data base file 20.

Figure 11A:
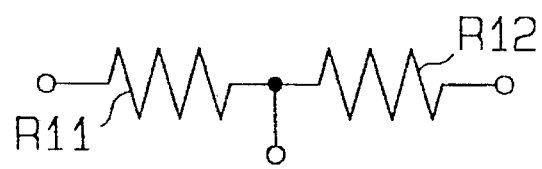
FIG. 11A shows an example of a series resistance circuit described in a circuit diagram.
Figure 11B:
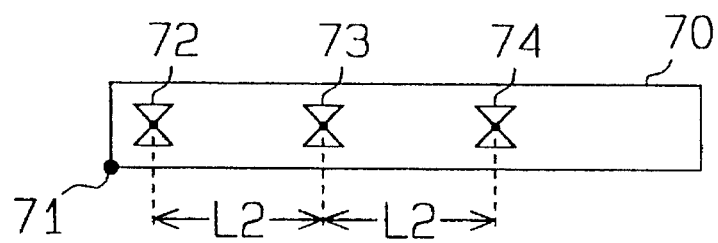
FIG. 11B shows the layout of contact hole patterns defining the series resistance circuit shown in FIG. 11A.
Figure 12A:
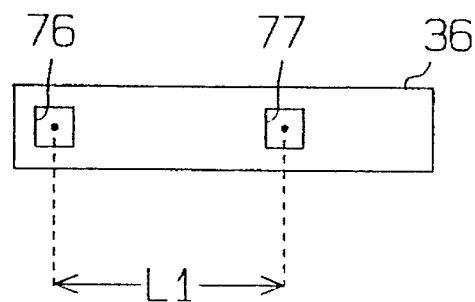
FIG. 12A shows resistance patterns corresponding to the layout shown in FIG. 9B.
Figure 12B:
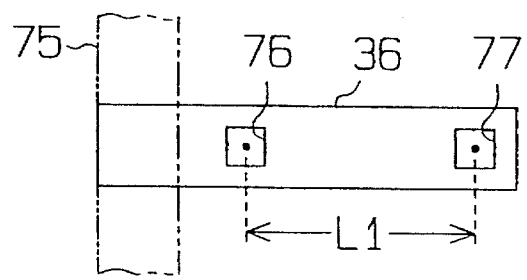
FIG. 12B shows resistance patterns corresponding to the layout shown in FIG. 10.
Figure 13:
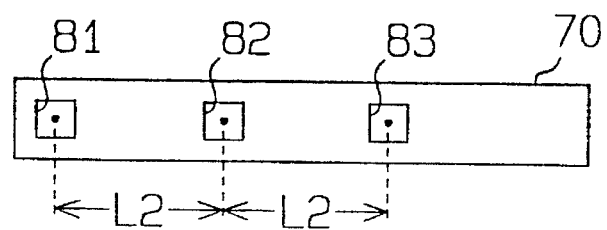
FIG. 13 shows resistance patterns corresponding to the layout shown in FIG. 11B.

According to a second example, a series resistance circuit composed of two resistors R11 and R12 as shown in FIG. 11A is defined in a resistive cell 70 as shown in FIG. 11B. The initial positions of second and third contact hole patterns 73 and 74 are spaced apart from the initial position of a first contact hole pattern 72 by intervals L2 and (2+L2), respectively. The coordinates of the respective centers of the second and third hole patterns 73 and 74 are registered in the sub-data base file 20.

The secondary contact hole position setting process is repeated for a number of times equal to the number of contact hole patterns formed in the selected resistive cell.

At Step 16, the layout process for the whole semiconductor chip is executed according to a layout program including a positioning program and a wiring program. The layout process is initiated in response to an instruction from a designer.

For example, the CPU 2 reads out a net list about the ECL circuit 23 shown in FIG. 4 from the sub-data base file 20, and also reads out information about the master slice 30 shown in FIG. 5 from the layout library file 21. A circuit diagram using various circuit symbols is displayed in the first window 5A on the screen of the CRT 5 in accordance with the net list, and the bulk model of the master slice 30 is displayed in the second window 5B. The bulk model symbolically displays a master slice bulk and the layout of transistor elements, resistive cells and capacitor elements, etc., which are provided in the master slice bulk.

The designer (i.e., CAD operator) can simultaneously observe the circuit diagram displayed in the first window 5A and the master slice bulk model displayed in the second window 5B. Accordingly, the designer can handle the circuit diagram and the master slice bulk model in correlation with each other while observing them simultaneously. The layout operation conducted by the designer will be explained below in more detail.

When the designer selects a specific symbol in the circuit diagram on the first window 5A, for example, the transistor Q1 in the ECL circuit 23, by operating the mouse 7, the transistor Q1 is regarded as being a target, and its position is determined on the master slice 30. At this time, the display color of the symbol representing the transistor Q1 is changed to a color different from the display color of the symbols of the other circuit elements which have not been selected yet, thereby indicating that the transistor Q1 has already been selected.

Next, the designer moves the cursor on the screen from the first window 5A to the second window 5B by operating the mouse 7, and selects one transistor cell 32 from the transistor cell groups in the bulk model by designating the cell 32 with the cursor. Consequently, the selected transistor cell is assigned to the transistor Q1 of the ECL circuit 23. Then, the CPU 2 checks whether or not the selected transistor cell 32 can be used as the transistor Q1 on the basis of the layout rules. When the transistor cell 32 cannot be used as the transistor Q1, the CPU 2 nullifies the selection of the cell 32 and waits for the operator to select another transistor cell with the mouse 7. When the transistor cell 32 can be used as the transistor Q1, the symbol display color of the cell 32 is changed to a color different from the symbol display color of the remaining cells in the bulk model, thereby indicating that the cell 32 has already been selected. Then, the CPU 2 registers the position of the transistor cell 32 as the layout position of the transistor Q1, in the sub-data base file 20.

When the designer operates the mouse 7 in order to select, for example, the resistor R1 symbol on the circuit diagram in the first window 5A, the CPU 2 regards the resistor R1 as being a target, and determines its position on the master slice 30. Consequently, the symbol display color of the resistor R1 is changed to indicate that the resistor R1 has already been selected, in the same way as the above description.

Next, the designer moves the cursor on the screen from the first window 5A into the second window 5B by operating the mouse 7, and selects one resistive cell 36 from the resistive cell groups in the bulk model. Consequently, the selected resistive cell 36 is used for the resistor R1 in the ECL circuit 23. At this time, the CPU 2 causes a pair of contact hole patterns such as the patterns 67 and 69 shown in FIG. 9B to be displayed in the region of the selected resistive cell 36. The CPU 2 accomplishes this by referring to the contact hole pattern data stored in the sub-data base file 20. When the resistive cell 36 can be used for the resistor R1, the symbol display color of the resistive cell 36 is changed to indicate that the cell 36 has already been used. Then, the CPU 2 registers the resistive cell 36 as a cell for the resistor R1 in the sub-data base file 20. Thus, a portion of the resistive cell 36 is utilized as a resistor having a predetermined resistance determined by the interval between the two contact hole patterns 67 and 69.

When all the circuit symbols in the circuit diagram displayed in the first window 5A have been assigned to the cells in the bulk model in the second window 5B, the wiring process connecting the cells is carried out. The wiring process is executed in response to the mouse operation in the same way as in the process of selecting or disposing circuit elements on the bulk model.

In the wiring process, the designer operates the mouse 7 in order to designate types of contact holes and wirings for connection between the elements. Wiring formed on the master slice can be designated by specifying start and end points of the wiring on the bulk model in the second window 5B with the cursor. The position of a contact hole pattern can be designated by specifying one point on the bulk model with the cursor. The CPU 2 checks whether or not it is possible to wire the specified start and end points on the basis of the design rules and the wiring rules. When it is impossible, the CPU 2 nullifies the designation of the start and end points and waits for the designer to specify another pair of start and end points by operating the mouse 7. On the other hand, when wiring between the start and end points is possible, the CPU 2 registers the wiring designation in the sub-data base file 20.

In the wiring process, as shown for example in FIG. 9B, a wiring pattern 75 may pass over the first contact hole pattern 67 in the resistive cell 36. If the wiring pattern 75 disposed at a given position has priority or more importance than that of the contact hole pattern, the CPU 2 shifts the first contact hole pattern 67 from that position. For the purpose of the contact hole pattern shift, the designer operates the mouse 7 to specify the first contact hole pattern 67 as a contact hole which is to be shifted and to designate a new position where it is to be disposed. The new position should be set on a straight line connecting the two contact hole patterns 67 and 69 and within the resistive cell 36.

Figure 10:
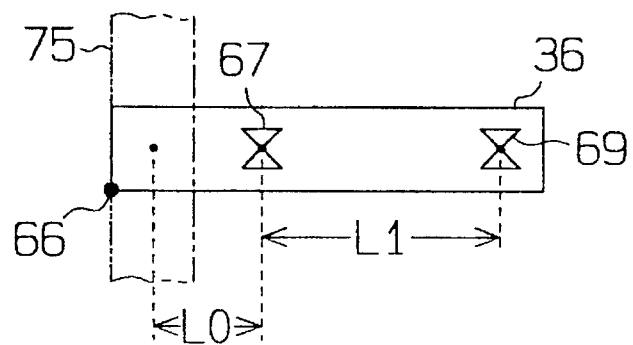
FIG. 10 illustrates contact hole patterns repositioned from the layout as shown in FIG. 9B.

After inputting a command to shift the first contact hole pattern 67 as a primary contact hole pattern, the CPU 2 obtains data about the range of distances over which the resistive cell 36 can be shifted. The CPU 2 determines this from the initial contact hole pattern position information 53 in the layout library file 21. The CPU 2 further obtains the resistance length L1 of the target resistor and the coordinates of the first contact hole pattern 67 from the sub-data base file 20. Then, the CPU 2 computes the amount of shift, L0, of the first contact hole pattern 67 as shown in FIG. 10.

When the first contact hole pattern 67 shifts right, for example, and when the first and second patterns are separated by a distance L1, the CPU determines if the second pattern is still within the resistive cell boundary. The determination may be made by either of two methods: a first method wherein it is judged whether or not the coordinates of the second contact hole pattern 69 obtained by adding the resistance length L1 to the coordinates of the shifted first contact hole pattern 67 are within the resistive cell 36; and a second method wherein it is judged whether or not the coordinates obtained by adding the shift amount L0 to the coordinates of the second contact hole pattern 69 before shifting are within the resistive cell 36.

When the coordinates of each of the shifted contact hole patterns 67 and 69 are within the resistive cell 36, the CPU 2 determines the position (i.e., coordinates) specified by the cursor to be new coordinates of the first contact hole pattern 67. New coordinates of the second contact hole pattern 69 are computed based on the new coordinates of the first contact pattern 67 and the resistance length.

Using layout rules, the CPU 2 inspects the shifted contact hole patterns 67 and 69 as well as the circuit connection. This inspection determines whether or not the shift of the contact hole patterns 67 and 69 created an error or abnormality in circuit layout. Thereafter, the CPU 2 changes the coordinates of each of the two contact hole patterns 67 and 69 in the sub-data base file 20 to the new coordinates.

At Step 17, preparation of resistor patterns is undertaken. In particular, the CPU 2 prepares data for the pattern of a resistive element to be formed on an actual master slice by referring to the information about each resistive element stored in the sub-data base file 20. During this pattern preparation process, the CPU 2 reads out the coordinates of contact hole patterns for each resistive element from the sub-data base file 20, and temporarily stores them in the work memory 4. Then, the CPU 2 transforms the coordinates in the work memory 4 into coordinates on the scale of the actual size, and additionally stores the transformed coordinates in the work memory 4. The CPU 2 reads out necessary parameter constants from the equation constant information 52 in the layout library file 21, referring to the resistive cell type information 49 stored in the sub-data base file 20. Based on the read parameter constants, the CPU 2 computes the size of the contact holes to be formed in the insulating layer over the resistive cell, and stores the computed contact hole size in the work memory 4. Thereafter, all the data in the work memory 4 is transferred to the sub-data base file 20 by the CPU 2.

At Step 18, mask patterns preparation process is executed. In the mask pattern preparation process, the CPU 2 prepares the resistor patterns prepared in the process illustrated at step 17, and wiring and contact hole patterns other than the resistor patterns.

The CPU 2 selects the code names of the specified contact hole patterns from the contact hole information 54 in the layout library file 21 by referring to the contact hole data stored in the sub-data base file 20. The CPU 2 prepares mask data, based on the selected code names and on the actual-size coordinates of the contact hole pattern data in the sub-data base file 20. The CPU 2 sequentially selects data on actual contact hole patterns using contact hole pattern code names from the pattern library file 22, and stores the selected data into the output file 10, thus completing the mask data.

As described above, according to this embodiment, a data base for managing elemental cell information and for designing a LSI, can be produced in the sub-data base file, based on a net list for the designed circuit and on information about elemental cells in the bulk of a master slice. Master slice type LSIs using various types of elements including resistive elements can be designed by utilizing a CAD system on the basis of information from the data base. This allows, LSIs to be designed even more efficiently than in the conventional CAD system. The presently described invention, moreover increases the reliability of the designed circuits.

In this embodiment, the CPU 2 automatically computes the length of each resistive element in a resistive cell, based on the length computation equation and the constants for the equation. Therefore, the resistance length can be computed even more accurately and rapidly than in the case of a conventional manual computation. In addition, since the CPU 2 automatically computes the resistance length, a designer or CAD operator needs not perform the complicated manual computation of resistance lengths.

The CPU 2 selects contact hole patterns in accordance with resistive cell types, and automatically positions a pair of contact hole patterns within a certain of resistive cell region according to the computed resistance length. This considerably improves the efficiency in designing LSIs, particularly LSIs for analog circuits. In a case where a contact hole pattern over a resistive cell region and a wiring pattern cross each other, the CPU repositions the pair of contact hole patterns within the resistive cell region while maintaining the resistance length, i.e., the interval between the contact hole patterns. This improves the efficiency in layout designing for Master Slice type LSIs.

Although only one embodiment of the present invention has been described herein, it should be apparent to those skilled in the art that the present invention may be embodied in many other specific forms without departing from the spirit or the scope of the invention.

Particularly, it should be understood that the resistance length computation equations in the foregoing embodiment may be incorporated in the control program.

Therefore, the present examples and embodiments are to be considered as illustrative and not restrictive, and the invention is not limited to the details given herein, but may be modified within the scope of the appended claims.

What is claimed is:

1. An interactive circuit designing apparatus for assisting an operator in designing a master slice type integrated circuit, said apparatus comprising:

a display device having a screen accommodating a first window for symbolically displaying circuit elements of a diagram of a circuit design, the circuit elements including a resistive element having a predetermined resistance, and a second window for displaying a bulk model of a master slice indicating circuit cells provided in the master slice, the circuit cells including a resistive cell;

an operator-manipulated input device for designating one of the circuit elements displayed in the first window and then designating one of the circuit cells displayed in the second window, associated with the designated circuit element, the designated circuit element being the resistive element and the designated circuit cell being the resistive cell;

data storage means for containing a first data base and a second data base, said first data base storing a net list descriptive of the circuit design, said second data base storing master slice data relating to a bulk structure of the master slice and cellular data relating to a plurality of types of circuit cells of the master slice; and a processing unit, coupled to said input device, said display device and said data storage means, wherein said processing unit:
   A) processes said net list and said master slice data to cause said display device to display the diagram of the circuit design in said first window and to display the bulk mode of the master slice in said second window;
   B) receives an instruction input thereto by the operator using said input device, said instruction representing the designated circuit element and the designated circuit cell associated with the designated circuit element, and prepares circuit cell data descriptive of the designated circuit by referring to said net list and the cellular data stored in the second data base, wherein the resistive element is to be formed in the designated resistive cell;
   C) computes a length of the resistive element to be formed in the designated resistive cell, wherein the length computation is based on said circuit cell data and on the resistance of the resistive element;
   D) prepares initial position data of a first contact hole for the designated resistive cell, based on said circuit cell data;
   E) prepares initial position data of a second contact hole paired with said first contact hole, based on said computed length and on the initial position data of said first contact hole, wherein the distance between said first and second contact holes corresponds to the computed length;
   F) creates a third data base in said data storage means, and stores data concerning said designated circuit cell, the computed length and the positions of said first and second contact holes into the third data base; and
   G) controls the display of said display device to display indications of the positions of the first and second contact holes, over the designated resistive cell in the bulk model of the master slice, with reference to the data stored in the third data base.

2. The apparatus according to claim 1, wherein the circuit of the circuit design is an analog integrated circuit.

3. The apparatus according to claim 1, wherein said input device is manipulated by an operator of said apparatus, and wherein said display device displays a cursor responsive to the manipulation by the operator.

4. The apparatus according to claim 1,
wherein the cellular data stored in said second data base includes data descriptive of length computation equations corresponding to individual resistive cell types; and wherein the cellular data stored in said second data base further includes resistive cell data comprising:
  i) equation type data describing the relationship between resistive cell types and the corresponding length computation equations;
  ii) data relating to parameter constants used in each computation equation;
  iii) data describing coordinates of a center of one of the first and second contact holes for the resistive cell types; and
  vi) hole type data describing the types of contact hole patterns to be provided over resistive cell types.

5. The apparatus according to claim 1, wherein:
the operator-manipulated input device designates a plurality of pairs of circuit elements and circuit cells, the plurality of pairs including circuit elements other than the resistive element and circuit cells other than the designated resistive cell, the processing unit receives an instruction representing the designated plurality of pairs and prepares circuit cell data descriptive the designated circuit cells of the designated plurality of pairs, and the processing unit stores data concerning the designated circuit cells of the designated plurality of pairs.

6. An interactive circuit designing apparatus for assisting an operator in designing a master slice type integrated circuit, said apparatus comprising:

a display device having a screen accommodating a first window for symbolically displaying circuit elements of a diagram of a circuit design, the circuit elements including a resistive element having a predetermined resistance, and a second window for displaying a bulk model of a master slice indicating circuit cells provided in the master slice, the circuit cells including a resistive cell;

an operator-manipulated input device for designating one of the circuit elements displayed in the first window and then designating one of the circuit cells displayed in the second window, associated with the designated circuit element, the designated circuit element being the resistive element and the designated circuit cell being the resistive cell;

data storage means for containing a first data base and a second data base, said first data base storing a net list descriptive of the circuit design, said second data base storing master slice data relating to a bulk structure of the master slice and cellular data relating to a plurality of types of circuit cells of the master slice; and a processing unit, coupled to said input device, said display device and said data storage means, wherein said processing unit:
  A) processes said net list and said master slice data to cause said display device to display the diagram of the circuit design in said first window and to display the bulk mode of the master slice in said second window;
  B) receives an instruction input thereto by the operator using said input device, said instruction representing the designated circuit element and the designated circuit cell associated with the designated circuit element, and prepares circuit cell data descriptive of the designated circuit by referring to said net list and the cellular data stored in the second data base, wherein the resistive element is to be formed in the designated resistive cell;
  C) computes a length of the resistive element to be formed in the designated resistive cell, wherein the length computation is based on said circuit cell data and on the resistance of the resistive element;
  D) prepares initial position data of a first contact hole for the designated resistive cell, based on said circuit cell data;
  E) prepares initial position data of a second contact hole paired with said first contact hole, based on said computed length and on the initial position data of said first contact hole, wherein the distance between said first and second contact holes corresponds to the computed length;
  F) creates a third data base in said data storage means, and stores data concerning said designated circuit cell, the computed length and the positions of said first and second contact holes into the third data base;
  G) controls the display of said display device to display indications of the positions of the first and second contact holes, over the designated resistive cell in the bulk model of the master slice, with reference to the data stored in the third data base; and
  H) revises the initial position data of the first and second contact holes to shift the positions of the first and second contact holes within the resistive cell while maintaining the distance between the first and second contact holes, in order to avoid interference between a wiring pattern on the master slice and the contact holes.

7. The apparatus according to claim 6, wherein after the positions of said first and second contact holes are shifted, revised position data of the first and second contact holes is stored in said third data base.

8. The apparatus according to claim 7, wherein said data storage means further contains a fourth data base for storing master slice circuit cell pattern data and circuit cell contact hole pattern data,
wherein said processing unit produces mask pattern data, based on the data stored in said fourth data base and on the data concerning said designated circuit cell and the data concerning the positions of said first and second contact holes stored in said third data base.

9. A method of preparing design data concerning a master slice type integrated circuit, said method comprising the steps of:
  A) storing in a first data base of a data storage means a net list descriptive of a circuit design;
  B) storing in a second data base of the data storage means master slice data relating to a bulk structure of a master slice and cellular data relating to a plurality of types of circuit cells of the master slice;
  C) processing said net list and said master slice data to cause a display device to display circuit elements of a diagram of the circuit design in a first window, the circuit elements including a resistive element having a predetermined resistance and display a bulk model of the master slice indicating circuit cells provided in the master slice, in a second window, the circuit cells including a resistive cell;
  D) receiving an instruction input to an input device by an operator, said instruction designating one of the circuit elements displayed in the first window and designating one of the circuit cells displayed in the second window, associated with the designated circuit element, the designated circuit element being the resistive element and the designated circuit cell being the resistive cell;

E) preparing circuit cell data descriptive of the designated circuit by referring to said net list and the cellular data stored in the second data base, wherein the resistive element is to be formed in the designated resistive cell;

F) computing a length of the resistive element to be formed in the designated resistive cell, wherein the length computation is based on said circuit cell data and on the resistance of the resistive element;

G) preparing initial position data of a first contact hole for the designated resistive cell, based on said circuit cell data;

H) preparing initial position data of a second contact hole paired with said first contact hole, based on said computed length and on the initial position data of said first contact hole, wherein the distance between said first and second contact holes corresponds to the computed length;

I) creating a third data base in said data storage means, and storing data concerning said designated circuit cell, the computed length and the positions of said first and second contact holes into the third data base; and J) controlling the display of said display device to display indications of the positions of the first and second contact holes, over the designated resistive cell in the bulk model of the master slice, with reference to the data stored in the third data base.

10. A method of preparing design data concerning a master slice type integrated circuit, said method comprising the steps of:

A) storing in a first data base of a data storage means a net list descriptive of a circuit design;

B) storing in a second data base of the data storage means master slice data relating to a bulk structure of a master slice and cellular data relating to a plurality of types of circuit cells of the master slice;

C) processing said net list and said master slice data to cause a display device to display circuit elements of a diagram of the circuit design in a first window, the circuit elements including a resistive element having a predetermined resistance and display a bulk model of the master slice indicating circuit cells provided in the master slice, in a second window, the circuit cells including a resistive cell;

D) receiving an instruction input to an input device by an operator, said instruction designating one of the circuit elements displayed in the first window and designating one of the circuit cells displayed in the second window, associated with the designated circuit element, the designated circuit element being the resistive element and the designated circuit cell being the resistive cell;

E) preparing circuit cell data descriptive of the designated circuit by referring to said net list and the cellular data stored in the second data base, wherein the resistive element is to be formed in the designated resistive cell;

F) computing a length of the resistive element to be formed in the designated resistive cell, wherein the length computation is based on said circuit cell data and on the resistance of the resistive element;

G) preparing initial position data of a first contact hole for the designated resistive cell, based on said circuit cell data;

H) preparing initial position data of a second contact hole paired with said first contact hole, based on said computed length and on the initial position data of said first contact hole, wherein the distance between said first and second contact holes corresponds to the computed length;

I) creating a third data base in said data storage means, and storing data concerning said designated circuit cell, the computed length and the positions of said first and second contact holes into the third data base;

J) controlling the display of said display device to display indications of the positions of the first and second contact holes, over the designated resistive cell in the bulk model of the master slice, with reference to the data stored in the third data base; and K) revising the initial position data of the first and second contact holes to shift the positions of the first and second contact holes within the resistive cell while maintaining the distance between the first and second contact holes, in order to avoid interference between a wiring pattern on the master slice and the contact holes.

* * * * *